United States Patent
Yoo et al.

(10) Patent No.: US 8,679,872 B2
(45) Date of Patent: Mar. 25, 2014

(54) LIGHT EMITTING DEVICE PACKAGE AND MANUFACTURING METHOD THEREOF

(75) Inventors: Cheol Jun Yoo, Chungcheongnam-do (KR); Young Hee Song, Gyeonggi-do (KR); Seong Deok Hwang, Seoul (KR); Sang Hyun Lee, Gyeonggi-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 44 days.

(21) Appl. No.: 13/312,572

(22) Filed: Dec. 6, 2011

(65) Prior Publication Data

US 2012/0138974 A1   Jun. 7, 2012

(30) Foreign Application Priority Data

Dec. 6, 2010   (KR) .................. 10-2010-0123509

(51) Int. Cl.
*H01L 21/00*   (2006.01)
*H01L 33/60*   (2010.01)

(52) U.S. Cl.
USPC ....... 438/27; 438/122; 257/680; 257/E33.068

(58) Field of Classification Search
USPC ................. 438/27, 122; 257/680, E33.068
See application file for complete search history.

(56) References Cited

U.S. PATENT DOCUMENTS

| | | | |
|---|---|---|---|
| 6,396,082 B1 * | 5/2002 | Fukasawa et al. | 257/79 |
| 7,211,832 B2 | 5/2007 | Hirose | |
| 7,381,996 B2 | 6/2008 | Hsin Chen | |
| 2002/0180040 A1 | 12/2002 | Camenforte et al. | |
| 2005/0139846 A1 * | 6/2005 | Park et al. | 257/98 |
| 2007/0080362 A1 * | 4/2007 | Scotch et al. | 257/99 |
| 2008/0143245 A1 | 6/2008 | Shiue et al. | |
| 2009/0302343 A1 * | 12/2009 | Sato et al. | 257/98 |

FOREIGN PATENT DOCUMENTS

KR   10-2009-0126624   12/2009

* cited by examiner

*Primary Examiner* — Caridad Everhart
(74) *Attorney, Agent, or Firm* — McDermott Will & Emery LLP (57) ABSTRACT

There is provided a light emitting device package including: a substrate having a circuit pattern formed on at least one surface thereof and including an opening; a wavelength conversion layer formed by filling at least a portion of the opening with a wavelength conversion material; and at least one light emitting device disposed on a surface of the wavelength conversion layer and electrically connected to the circuit pattern.

25 Claims, 8 Drawing Sheets

LIGHT EMITTING DEVICE PACKAGE AND MANUFACTURING METHOD THEREOF

CROSS-REFERENCE TO RELATED APPLICATIONS

This application claims the priority of Korean Patent Application No. 10-2010-0123509 filed on Dec. 6, 2010, in the Korean Intellectual Property Office, the disclosure of which is incorporated herein by reference.

BACKGROUND OF THE INVENTION

1. Field of the Invention

The present invention relates to a light emitting device package and a manufacturing method thereof allowing for improved light uniformity by forming a wavelength conversion layer in an opening of a substrate.

2. Description of the Related Art

Recently, as the brightness of a light emitting device such as a light emitting diode (LED) has increased, such a light emitting device has been used as a light source for a display device, a lighting apparatus or a car. A light emitting device is able to emit white light by using phosphors or by combining light of various colors. In order to use an LED for such a purpose, the device should be low in operational voltage and high in light emission efficiency and brightness.

The most general method for the implementation of a white LED converts light wavelengths by using a blue LED and a yellow phosphor and combines blue light and yellow light to thereby emit white light. In this method, the efficiency of phosphors may greatly affect the emission of white light.

A general structure of a white LED using a phosphor layer is manufactured as a package. An LED is die-bonded to a lead frame formed of a conductive metal using a bonding resin and a filling material formed of a composite resin such as silicon resin, epoxy resin or the like is molded around the upper part of the LED. In order to allow the LED to emit white light, a phosphor powder is mixed with the filling material and the mixture is molded in the lead frame package having the LED bonded thereto.

Such a white LED package emits white light in a manner such that a portion of the blue light emitted from the blue LED is transmitted while the remainder thereof reaches the phosphors included in the filling material, causing yellow light through the excitation of the phosphors to be emitted, and thus blue light and yellow light are combined to thereby emit white light. In this case, a difference in the paths of light beams is caused when light reaches the outer surface of the package, and accordingly, it may be difficult to achieve light uniformity. In addition, due to the non-uniformity of the phosphors included in the filling material, color reproduction characteristics may be reduced.

SUMMARY OF THE INVENTION

An aspect of the present invention provides a light emitting device package and a method of manufacturing the same allowing for improved light uniformity by forming a wavelength conversion layer within an opening of a substrate.

According to an aspect of the present invention, there is provided a light emitting device package including: a substrate having a circuit pattern formed on at least one surface thereof and including an opening therein; a wavelength conversion layer formed by filling at least a portion of the opening with a wavelength conversion material; and at least one light emitting device disposed on a surface of the wavelength conversion layer and electrically connected to the circuit pattern.

The light emitting device may be disposed on the same plane as that of the surface of the substrate on which the circuit pattern is formed.

At least one surface of the substrate and the wavelength conversion layer may be coplanar.

The substrate and the wavelength conversion layer may have the same thickness.

The wavelength conversion layer may be formed by filling the entirety of the opening with the wavelength conversion material such that the thickness and shape thereof is defined by the opening.

The wavelength conversion layer may be formed of a light-transmissive material containing phosphors.

The light emitting device package may further include a heat sink in contact with the light emitting device.

The light emitting device package may further include a bump attached to the circuit pattern of the substrate.

The opening may have a size larger than or equal to that of the light emitting device.

The opening may include an inclined surface in at least a portion of an inner surface thereof.

At least a portion of the light emitting device may be disposed within the opening.

The substrate may be a printed circuit board.

The circuit pattern of the substrate may be bonded to the light emitting device by a wire.

The wire may be sealed with a highly reflective white resin.

The light emitting device may include a plurality of light emitting devices, each of which independently receives an electrical signal from the circuit pattern.

The light emitting device package may further include a light-transmissive lens disposed on the wavelength conversion layer.

The light-transmissive lens may cover a surface of the wavelength conversion layer.

The light-transmissive lens may have an unevenness portion on a surface thereof.

The light emitting device may include a plurality of light emitting devices, and the plurality of light emitting devices may be disposed on the surface of the wavelength conversion layer formed within the opening of the substrate.

According to another aspect of the present invention, there is provided a method of manufacturing a light emitting device package, the method including: preparing a substrate having a circuit pattern formed on at least one surface thereof and including an opening; filling at least a portion of the opening with a wavelength conversion material to thereby form a wavelength conversion layer; disposing at least one light emitting device on a surface of the wavelength conversion layer disposed on the same plane as that of the surface of the substrate on which the circuit pattern is formed; and making electrical connection between the light emitting device and the circuit pattern of the substrate.

The electrical connection between the light emitting device and the circuit pattern of the substrate may be made by wire-bonding therebetween using a wire.

The wire may be sealed with a highly reflective white resin.

The method may further include disposing a heat sink on an upper surface of the light emitting device so as to be in contact therewith.

The method may further include disposing a light-transmissive lens on an upper surface of the wavelength conversion layer.

The method may further include attaching a bump to the circuit pattern of the substrate so as to receive an electrical signal from an external outer source.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

The invention may, however, be embodied in many different forms and should not be construed as being limited to the embodiments set forth herein. Rather, these embodiments are provided so that this disclosure will be thorough and complete, and will fully convey the scope of the invention to those skilled in the art.

In the drawings, the shapes and dimensions may be exaggerated for clarity, and the same reference numerals will be used throughout to designate the same or like components.

Figure 1:
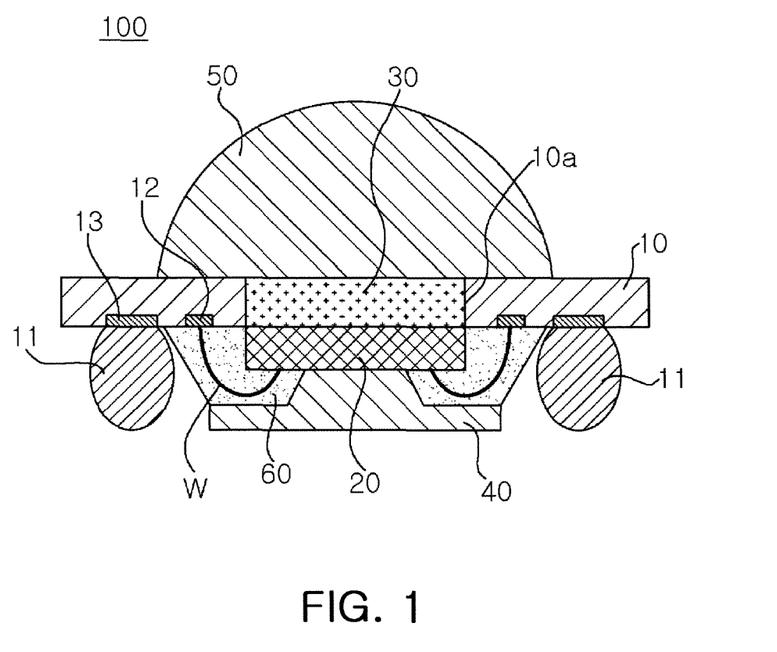
FIG. 1 is a schematic cross-sectional view of a light emitting device package according to a first exemplary embodiment of the present invention.
Figure 2A:
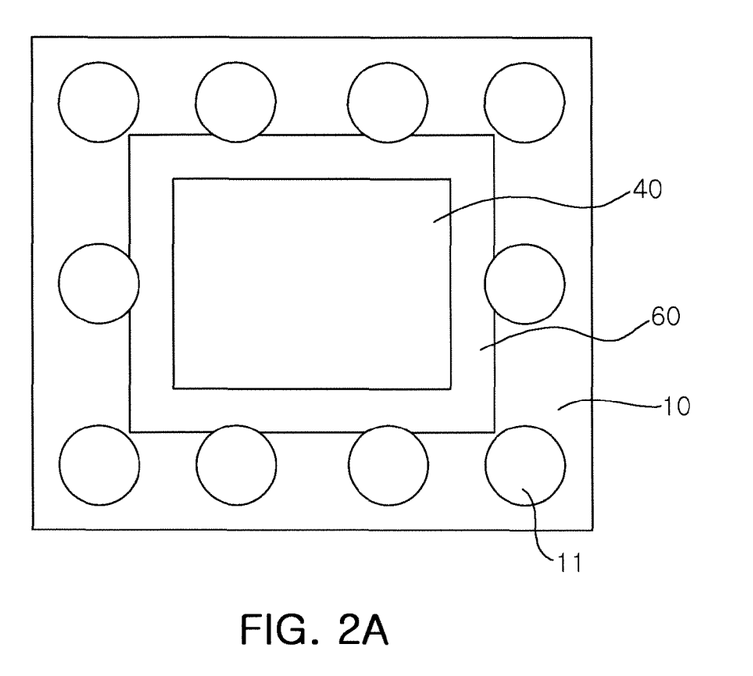
FIGS. 2A and 2B are bottom and top views of the light emitting device package according to the first exemplary embodiment of the present invention.
Figure 2B:
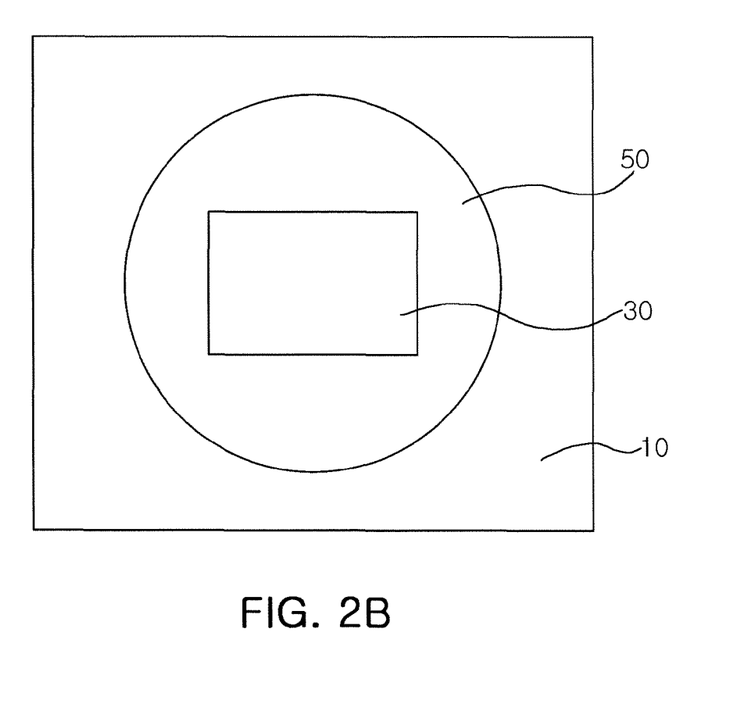

FIG. 1 is a schematic cross-sectional view of a light emitting device package according to a first exemplary embodiment of the present invention. FIGS. 2A and 2B are bottom and top views of the light emitting device package according to the first exemplary embodiment of the present invention. With reference to FIG. 1, a light emitting device package 100 according to the first exemplary embodiment of the invention includes a substrate 10 including an opening 10a, a wavelength conversion layer 30 formed by filling at least a portion of the opening 10a with a wavelength conversion material, a light emitting device 20 disposed on a surface of the wavelength conversion layer 30. A heat sink 40 may be further provided on a surface of the light emitting device 20 for the radiation of heat therefrom. The light emitting device 20 may be bonded to a bonding pad 12 formed in the substrate 10 by a wire W. The wire W may be sealed with a highly reflective white resin. A bump pad 13 formed in the substrate 10 may be electrically connected to an external power source via a bump 11. A light-transmissive lens may be further provided on an upper surface of the wavelength conversion layer 30 so as to adjust the orientation angle of light wavelength-converted by the wavelength conversion layer 30.

In the present embodiment, although not shown, the light emitting device 20 may include a first conductivity type semiconductor layer, an active layer and a second conductivity type semiconductor layer. The first and second conductivity type semiconductor layers may be n-type and p-type semiconductor layers, respectively, and may be formed of a nitride semiconductor. The first and second conductivity type semiconductor layers may be expressed by $Al_xIn_yGa_{(1-x-y)}N$, wherein $0 \leq x \leq 1$, $0 \leq y \leq 1$ and $0 \leq x+y \leq 1$. For example, GaN, AlGaN, InGaN or the like may be used therefor. The active layer provided between the first and second conductivity type semiconductor layers emits light having a predetermined level of energy through electron-hole recombination. The active layer may have a multi-quantum well (MQW) structure in which quantum well and quantum barrier layers are alternately stacked. The multi-quantum well structure may employ an InGaN/GaN structure, for example.

The wavelength conversion layer 30 formed by filling at least a portion of the opening 10a of the substrate 10 with a wavelength conversion material may include phosphors for light wavelength conversion allowing for the conversion of a wavelength of light emitted from the active layer of the light emitting device 20. The phosphors may convert light to have any one of yellow, red and green wavelengths or may be combined to convert light to have a plurality of wavelengths. Types of phosphors may be determined by the wavelength of light emitted from the active layer of the light emitting device 20. Specifically, the wavelength conversion layer 30 may include at least one of YAG-based phosphors, TAG-based phosphors, silicate-based phosphors, sulfide-based phosphors and nitride-based phosphors. For example, in a case in which phosphors for converting light to have a yellow wavelength are applied to a blue light emitting LED chip, a semiconductor light emitting device emitting white light may be obtained.

The wavelength conversion layer 30 may be formed by combining a transparent resin such as silicon resin, epoxy resin, or the like with the phosphors and an inorganic filler. The inorganic filler may be used to ensure proper viscosity according to a method of processing the wavelength conversion layer, and $Al_2O_3$, $SiO_2$ or the like ranging from several nm to several hundreds of nm may be suitable therefor. Since an organic or inorganic spacer having superior light transmissivity may be added to the wavelength conversion layer 30, the thickness of the wavelength conversion layer 30 may be uniformly maintained, whereby light distribution may be improved. The wavelength conversion layer 30 may be formed by attaching a carrier tape to the lower part of the substrate 10 and filling at least a portion of the opening 10a of the substrate 10 with the wavelength conversion material using a known method such as dispensing, printing, MOCVD (metal organic chemical vapor deposition), ALD (atomic layer deposition), RF-sputtering, e-beam evaporation, thermal evaporation or the like.

As shown in FIG. 1, the wavelength conversion layer 30 may be formed to have the same thickness as that of the substrate 10 within the opening 10a of the substrate 10 such that it may be coplanar with a surface of the substrate 10. That is, since the wavelength conversion layer 30 including the phosphors is formed within the opening 10a of the substrate 10, the thickness and position thereof may be easily controlled. Since the wavelength conversion layer 30 may be formed to have a uniform thickness on a light emitting surface of the light emitting device 20, the distribution of light, wavelength-converted by the wavelength conversion layer 30, may be improved, and accordingly, light uniformity may be enhanced and color stains may be reduced.

The light emitting device 20 may be attached to a lower surface of the wavelength conversion layer 30, and the surface thereof attached to the wavelength conversion layer 30 may be provided as a light emitting surface. The light, emitted from the active layer of the light emitting device 20, may pass through the wavelength conversion layer 30 formed within the opening 10a of the substrate 10, and thus wavelength-converted light may be emitted. An area of a contact surface between the light emitting device 20 and the wavelength conversion layer 30 may be smaller than or equal to an area of the wavelength conversion layer 30 such that the entirety of the light emitted from the light emitting device 20 may pass through the wavelength conversion layer 30.

The heat sink 40 may be provided on a lower surface of the light emitting device 20 disposed on the surface of the wavelength conversion layer 30. Specifically, the heat sink 40 may be disposed on a surface of the light emitting device 20 which is not provided as a light emitting surface, i.e., on a surface thereof opposed to the contact surface attached to the wavelength conversion layer 30. The heat sink 40 is in direct contact with the light emitting device 20 and serves to absorb heat radiated from the light emitting device 20 and emit the heat to the outside. The heat sink 40 may be formed of a material having superior thermal conductivity such as copper, aluminum, stainless steel or the like. Heat emission may be increased by maximizing a surface area of the heat sink 40 so that the deterioration of the characteristics of the light emitting device 20 may be prevented and the reliability thereof may be enhanced.

The substrate 10 may be a printed circuit board (PCB). The substrate 10 may be formed of an organic resin material containing epoxy resin, triazine resin, silicone resin, polyimide resin, or the like, other organic resin materials, a ceramic material such as AlN, $Al_2O_3$ or the like, or metals and metallic compounds. Specifically, the substrate 10 may be a metal core printed circuit board (MCPCB), one type of a metal PCB. A circuit pattern may be formed on a surface of the substrate 10 for electrical wiring. As shown in FIG. 1, the substrate 10 may include the bonding pad 12 electrically connected to the light emitting device 20 and the bump pad 13 connected to the bump 11 to receive an electrical signal from an external power source.

Here, electrodes formed in the first and second conductivity type semiconductor layers of the light emitting device 20 may be wire-bonded to the bonding pad 12, and the wire W may be sealed with a highly reflective white resin. A sealing portion 60, sealing the wire W, may protect the light emitting device 20 and the wire W and be formed of a highly reflective white resin, thus serving to reflect light emitted from the sides of the light emitting device 20 and direct the light upwardly to thereby increase light emitting efficiency. In a case in which the wire-bonded surface of the light emitting device 20 includes a reflective layer and it is not provided as a light emitting surface, the sealing portion 60 sealing the wire W is not required to be white. In this case, the sealing portion 60 may be formed of a colored sealing material having superior mechanical properties.

The lens 50 formed on the upper surface of the substrate including the wavelength conversion layer 30 therein completely covers the wavelength conversion layer 30 formed on the light emitting device 20 to thereby protect the light emitting device 20 and the wavelength conversion layer 30. Also, the lens 50 may have a hemispherical shape, thereby reducing Fresnel reflectivity in a boundary thereof and increasing light extraction efficiency. Here, the lens 50 may be formed of a resin including at least one of epoxy resin, silicone resin, modified silicone resin, urethane resin, oxetane resin, acrylic resin, polycarbonate resin and polyimide resin. In addition, the lens may have unevenness portions on an upper surface thereof, thereby increasing light extraction efficiency and adjusting the directivity of the light emitted therefrom. The shapes of the wavelength conversion layer 30 and the lens 50 may be variously modified according to necessity.

FIGS. 2A and 2B are bottom and top views of the light emitting device package according to the first exemplary embodiment of the present invention. FIG. 2A is a view of the light emitting device package of FIG. 1 as viewed from below, and FIG. 2B is a view of the light emitting device package of FIG. 1 as viewed from above. With reference to FIG. 2A, the heat sink 40 formed of a material having superior thermal conductivity may be disposed on a bottom surface of the light emitting device package 100, and thus heat generated from the light emitting device 20 is effectively emitted to the outside. The heat sink 40 may have a wide area so as to maximize a contact area with the outside. When the light emitting device package 100 is mounted on a mounting substrate (not shown), both the bump 11 and the heat sink 40 contact the mounting substrate, so that heat dissipation can be enhanced. As viewed from an upper surface of the light emitting device package 100 with reference to FIG. 2B, the wavelength conversion layer 30 formed on the upper surface of the light emitting device 20 may be disposed thereon, and the light-transmissive lens 50 may be disposed thereon in order to adjust the orientation angle of light wavelength-converted by the wavelength conversion layer 30.

Figure 3:
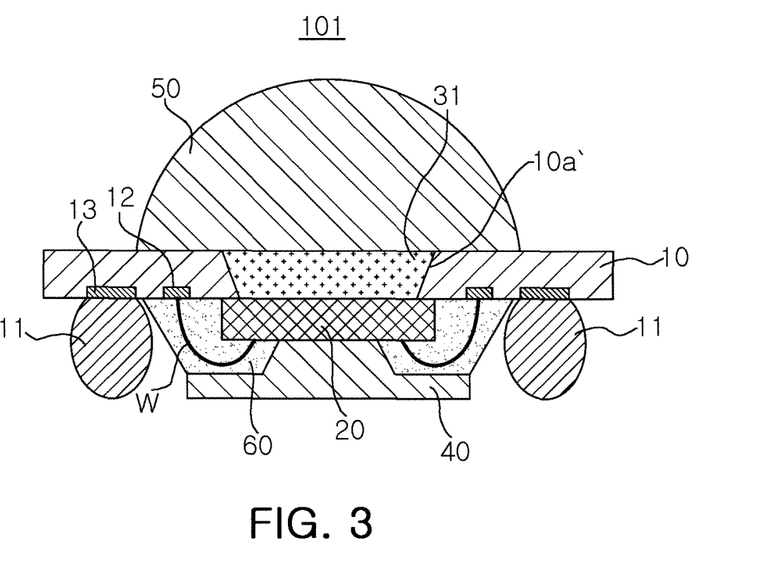
FIG. 3 is a schematic cross-sectional view of a light emitting device package according to a second exemplary embodiment of the present invention.

FIG. 3 is a schematic cross-sectional view of a light emitting device package according to a second exemplary embodiment of the present invention. With reference to FIG. 3, unlike the first exemplary embodiment, at least a portion of an inner surface of an opening 10a' formed in the substrate 10 may include an inclined surface, and a wavelength conversion layer 31 may be formed by filling at least a portion of the inclined opening 10a' with a wavelength conversion material. The same reference numerals are used to designate the same elements as those in the first exemplary embodiment, and only elements having different features will be described in detail. Since the opening 10a' of the substrate 10 includes the inner inclined surface, light emitted from the wavelength conversion layer 31 formed within the opening 10a' of the substrate 10 is reflected from the inclined surface of the opening 10a' to be directed upwardly, whereby external light extraction efficiency may be enhanced. Furthermore, since the opening 10a' has the inclined surface, the contact area between the wavelength conversion layer 31 and the substrate 10 increases, which results in an increase in coupling strength therebetween. Accordingly, the reliability of a light emitting device package 101 may be enhanced.

Figure 4:
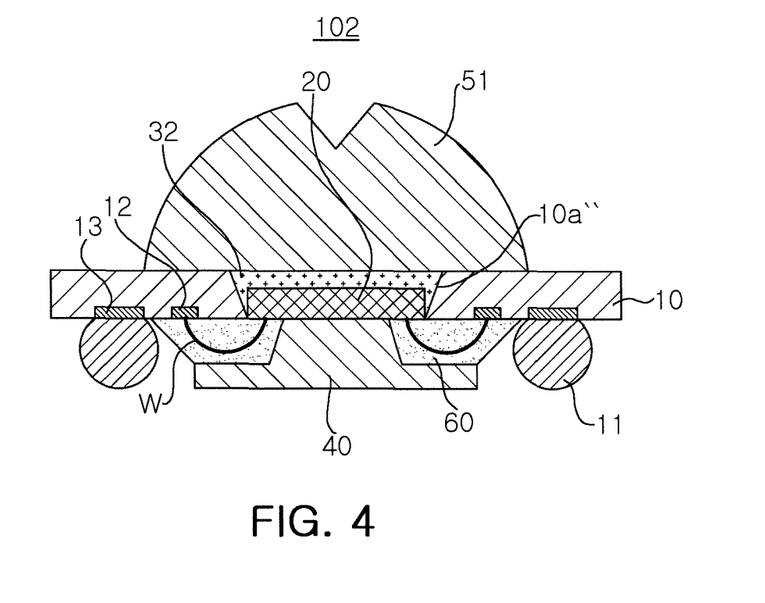
FIG. 4 is a schematic cross-sectional view of a light emitting device package according to a third exemplary embodiment of the present invention.

FIG. 4 is a schematic cross-sectional view of a light emitting device package according to a third exemplary embodiment of the present invention. In a light emitting device package 102 according to this embodiment, at least a portion of an inner surface of an opening 10a" formed in the substrate 10 may include an inclined surface, like the light emitting device package 101 according to the second exemplary embodiment shown in FIG. 3. However, the light emitting device package 102 has a different structure, in that the light emitting device 20 is not disposed outside of the opening 10a" of the substrate 10, but is disposed within the opening 10a". In the present embodiment, the entirety of the light emitting device 20 is disposed within the opening 10a" by way of example; however, the invention is not limited thereto and only a portion of the light emitting device 20 may be disposed within the opening 10a". Since the light emitting device 20 is embedded within a wavelength conversion layer 32, the contact area between the light emitting device 20 and the wavelength conversion layer 32 increases, whereby the mechanical reliability of the light emitting device package 102 may be enhanced and the thickness thereof may be reduced. Also, in a case in which the entirety of a light emitting surface of the light emitting device 20 is embedded within the wavelength conversion layer 32, the sealing portion 60 may be formed of a colored sealing material.

With reference to FIG. 4, a lens 51 may have an unevenness portion formed on a portion of the surface thereof. In the present embodiment, a concave portion is formed in the surface of the lens 51; however, the invention is not limited thereto. A concave or convex portion may be formed on the surface of the lens 51 according to orientation angle. Unevenness portions including a plurality of concave and convex portions may be provided to thereby adjust the orientation angle of light emitted toward the outside and increase light extraction efficiency in an interface between the unevenness portions and the outside.

Figure 5:
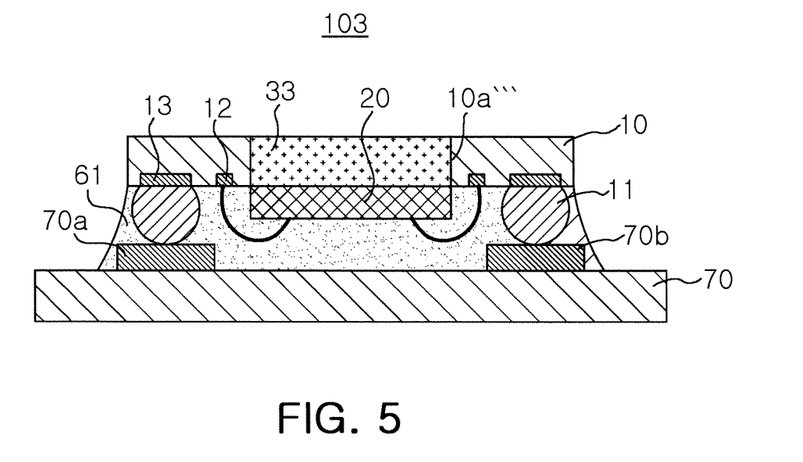
FIG. 5 is a schematic cross-sectional view of a light emitting device package according to a fourth exemplary embodiment of the present invention.

FIG. 5 is a schematic cross-sectional view of a light emitting device package according to a fourth exemplary embodiment of the present invention. A light emitting device package 103 according to this embodiment includes the substrate 10 having an opening 10a''', a wavelength conversion layer 33 formed within the opening 10a''' of the substrate 10, and the light emitting device 20 disposed on the wavelength conversion layer 33. Unlike the first to third embodiments, the light emitting device package 103 according to the present embodiment does not include a lens disposed on an upper surface of the wavelength conversion layer 33 and a heat sink disposed on the light emitting device 20. According to this embodiment, the light emitting device 20 is wire-bonded to the bonding pad 12 formed on the substrate 10, and the bump 11 formed on the bump pad 13 electrically connected to a circuit pattern formed on the substrate 10 may be connected to circuit patterns 70a and 70b formed on a mounting substrate 70 for the mounting of the light emitting device package 103 to thereby receive an electrical signal from an external power source. A space between the mounting substrate 70 for mounting the light emitting device package 103 and the substrate 10 having the light emitting device 20 therein may be filled with a sealing material such as epoxy resin or the like, thereby forming a sealing portion 61. The sealing portion 61 may protect the light emitting device 20 and the wire W from the outside and allow the light emitting device package 103 to have solidity, whereby the reliability of the light emitting device package 103 may be enhanced.

Figure 6:
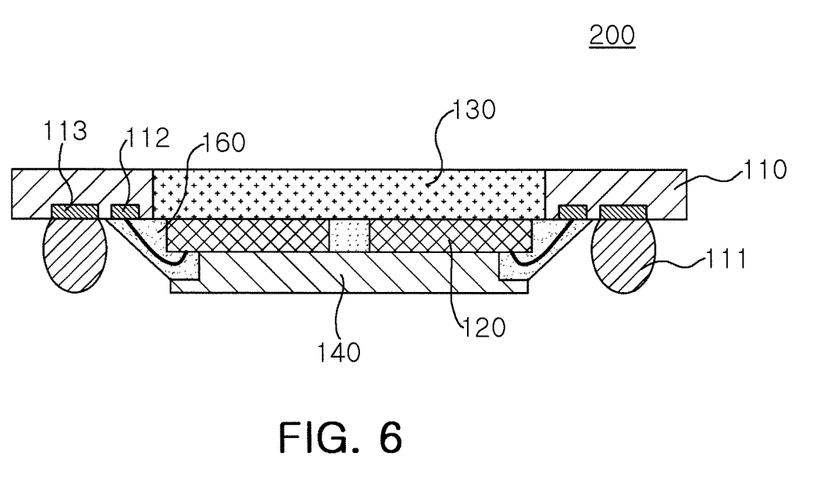
FIG. 6 is a schematic cross-sectional view of a light emitting device package according to a fifth exemplary embodiment of the present invention.
Figure 7A:
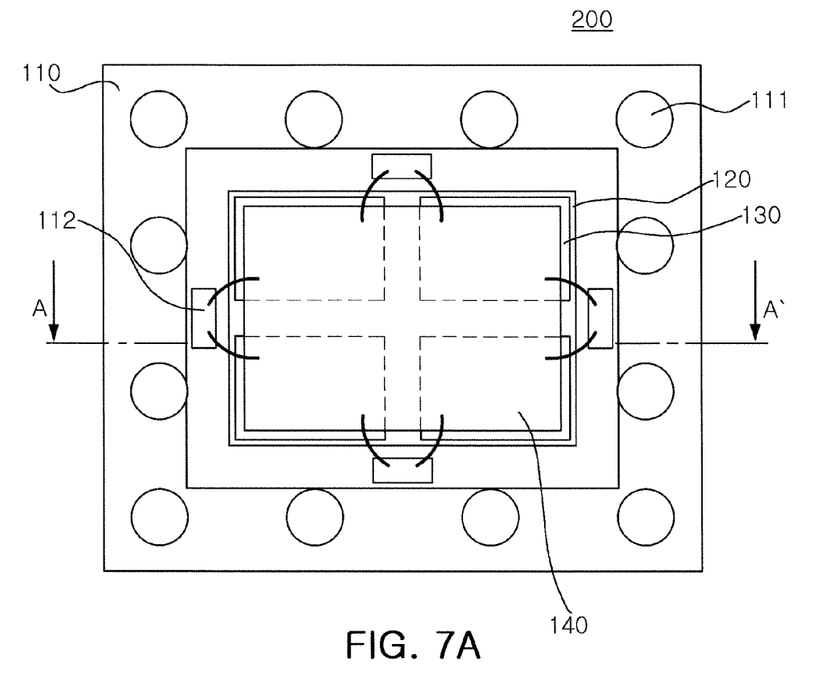
FIGS. 7A and 7B are top and bottom views of the light emitting device package according to the fifth exemplary embodiment of the present invention.
Figure 7B:
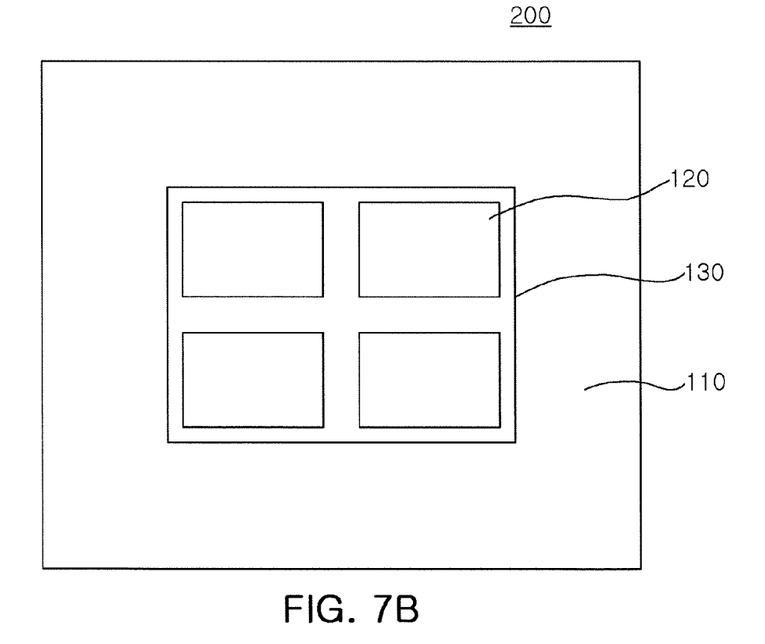

FIG. 6 is a schematic cross-sectional view of a light emitting device package according to a fifth exemplary embodiment of the present invention. FIG. 7A is a view of the light emitting device package of FIG. 6 as viewed from above, and FIG. 7B is a view of the light emitting device package of FIG. 6 as viewed from below. With reference to FIG. 6, unlike the first to fourth embodiments, a light emitting device package 200 according to the present embodiment includes a plurality of light emitting devices 120 disposed on a wavelength conversion layer 130, and thus a multi-chip light emitting device package may be manufactured. With reference to FIG. 6, a substrate 110 includes an opening 110a and the wavelength conversion layer 130 may be formed by filling at least a portion of the opening 110a with a wavelength conversion material. The plurality of light emitting devices 120 may be disposed on the wavelength conversion layer 130, and a heat sink 140 may be further provided for the radiation of heat on upper surfaces of the plurality of light emitting devices 20.

With reference to FIG. 7A, bonding pads 112 may be formed between the plurality of the light emitting devices 120 on a surface of the substrate 110 to be shared by the plurality of the light emitting devices 120. The light emitting devices 120 may be wire-bonded to the bonding pads 112. The bonding pads 112 may be independently disposed for the respective light emitting devices 120 and individually apply an electrical signal to the respective light emitting devices 120. Specifically, a single heat sink 140 may be disposed with respect to the plurality of light emitting devices 120 and the bonding pads 112 may be disposed around the periphery of the heat sink 140. This configuration is merely an example of electrical wiring, and the invention is not limited thereto. The positions of electrical wires and electrode pads may be variously modified according to necessity.

Figure 8:
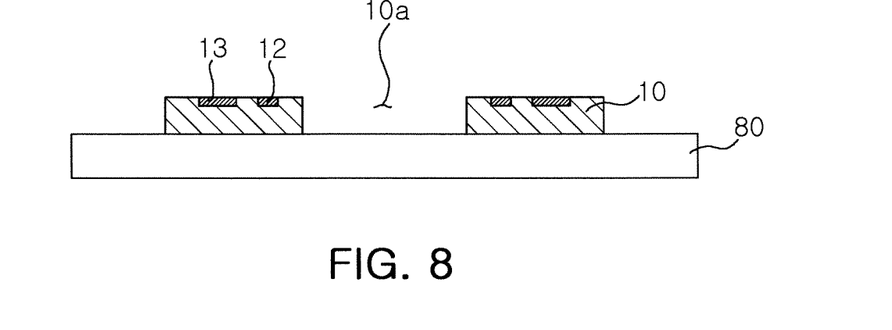
FIGS. 8 through 14 are views illustrating a method of manufacturing a light emitting device package according to an exemplary embodiment of the present invention.

FIGS. 8 through 14 are views illustrating a method of manufacturing a light emitting device package according to an exemplary embodiment of the present invention. In particular, FIGS. 8 through 14 illustrate subsequent processes of manufacturing the light emitting device package 100 shown in FIG. 1. With reference to FIG. 8, the substrate 10 having a circuit pattern formed in at least one surface thereof may be disposed on a carrier film 80. The substrate 10 may have the opening 10a penetrating through the substrate 10 and the circuit pattern may include the bonding pad 12 and the bump pad 13. As shown in FIG. 8, the circuit pattern may be embedded in one surface of the substrate 10. Otherwise, the circuit pattern may be protruded from the upper surface of the substrate 10.

Figure 9:
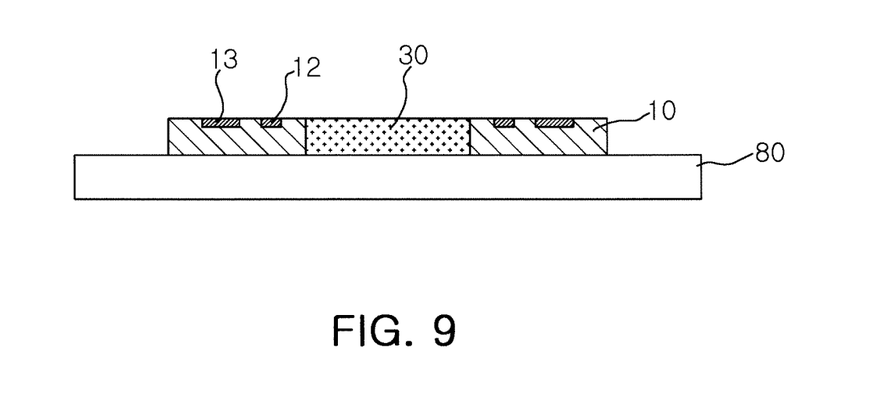

Next, as shown in FIG. 9, the wavelength conversion layer 30 may be formed by filling the opening 10a of the substrate 10 with a wavelength conversion material. The wavelength conversion layer 30 is formed by filling the entirety of the opening 10a such that the surface thereof may be coplanar with the surface of the substrate 10; however, the invention is not limited thereto and the wavelength conversion layer 30 may be formed by filling only a portion of the opening 10a. Since the wavelength conversion layer 30 is formed within the opening 10a of the substrate in a state in which the substrate 10 is disposed on the carrier film 80, a contact surface between the substrate 10 and the carrier film 80 is coplanar with a contact surface between the wavelength conversion layer 30 and the carrier film 80. The wavelength conversion layer 30 may be formed to have a desired thickness in a desired position according to the size and position of the opening 10a, and thus a light emitting device package having improved color distribution may be provided.

Figure 10:
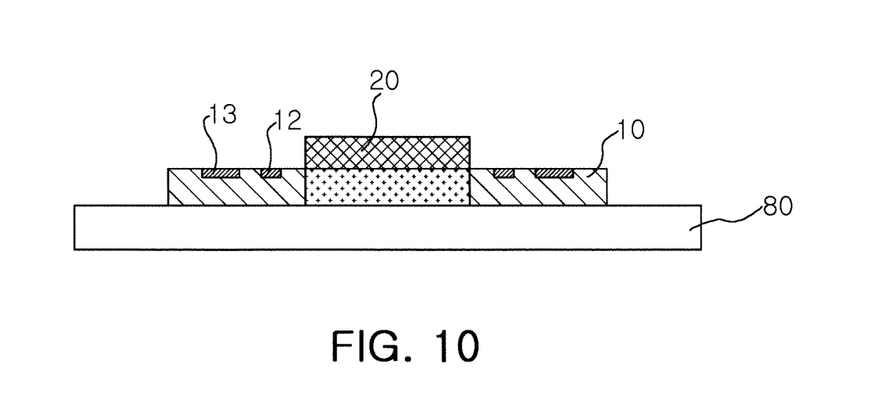

Then, as shown in FIG. 10, the light emitting device 20 may be disposed on the surface of the wavelength conversion layer 30. The light emitting device 20 may be disposed on the same plane as that of the surface of the substrate 10 in which the circuit pattern is formed. Light emitted from the light emitting device 20 may be wavelength-converted by the wavelength conversion layer 30 to be emitted to the outside. As described above, in the present embodiment, the wavelength conversion layer 30 is formed by filling the entirety of the opening 10a of the substrate 10 with the wavelength conversion material and the light emitting device 20 is disposed on the upper surface of the substrate 10; however, the invention is not limited thereto. The light emitting device 20 may be disposed within the opening 10a. Specifically, the wavelength conversion layer 30 is formed by filling only a portion of the opening 10a of the substrate 10 and the entirety or a portion of the light emitting device 20 is disposed within the opening 10a such that the portion or entirety of the light emitting device 20 may be embedded in the wavelength conversion layer 30.

Figure 11:
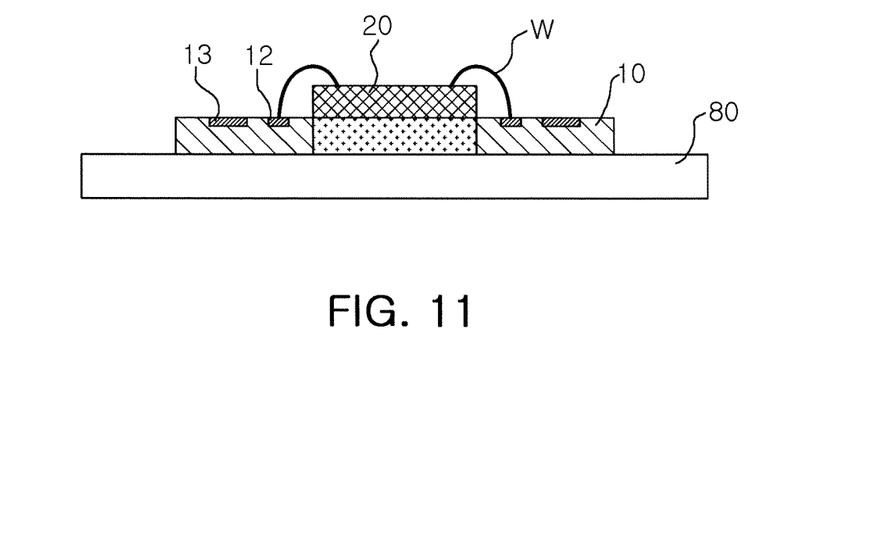

Thereafter, as shown in FIG. 11, the circuit pattern formed in the substrate 10 and the light emitting device 20 may be electrically connected to each other. The circuit pattern may include the bonding pad 12 and the bump pad 13 as described above, and the bonding pad 20 formed in the substrate 10 may be wire-bonded to an electrode (not shown) formed in the light emitting device 20. The light emitting device 20 is wire-bonded to the substrate 10 such that it may receive an electrical signal from the outside. However, a method for the electrical connection between the light emitting device 20 and the substrate 10 is not limited thereto. The light emitting device 20 and the substrate 10 may be electrically connected by using a known method.

Figure 12:
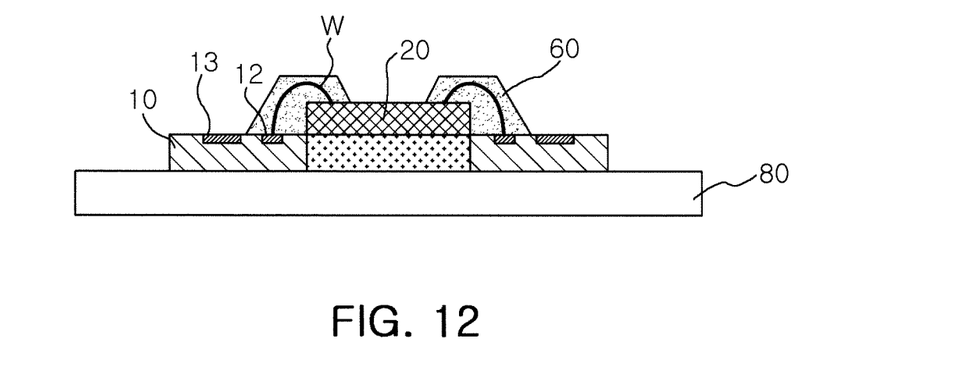

Then, as shown in FIG. 12, the wire W may be sealed with a resin. The sealing portion 60, sealing the wire W, may protect the light emitting device 20 and the wire W and may be formed of a highly reflective white resin. In a case in which the sealing portion 60 is formed of a highly reflective white resin, it may serve to reflect light emitted from sides of the light emitting device 20 and direct the light upwardly to thereby increase light emitting efficiency. In a case in which the wire-bonded surface of the light emitting device 20 includes a reflective layer and it is not provided as a light emitting surface, the sealing portion 60 sealing the wire W is not required to be white. In this case, the sealing portion 60 may be formed of a colored sealing material having superior mechanical properties.

Figure 13:
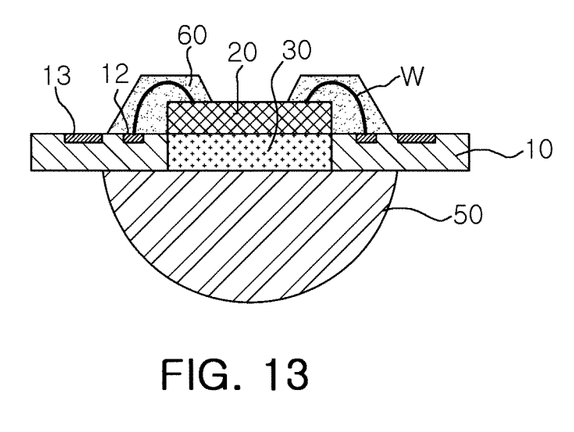

Thereafter, with reference to FIG. 13, the carrier film 80 may be removed and the light-transmissive lens 50 may be disposed on the surface from which the carrier film 80 is removed. The light-transmissive lens 50 completely covers the wavelength conversion layer 30 formed on the light emitting device 20 to thereby protect the light emitting device 20 and the wavelength conversion layer 30. Also, the lens 50 may have a hemispherical shape, thereby reducing Fresnel reflectivity in a boundary and increasing light extraction efficiency. Here, the lens 50 may be formed of a resin including at least one of epoxy resin, silicone resin, modified silicone resin, urethane resin, oxetane resin, acrylic resin, polycarbonate resin and polyimide resin. The lens 50 in the present embodiment has a hemispherical shape; however, the shape of the lens 50 is not limited thereto and may be variously modified according to necessity.

Figure 14:
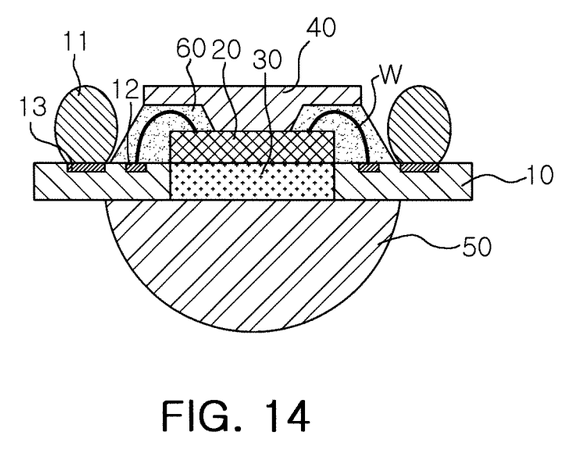

Then, as shown in FIG. 14, the heat sink 40 may be disposed to be in direct contact with the light emitting device 20 and the bump 11 may be disposed on the bump pad 13. The heat sink 40 may be formed of a material having superior thermal conductivity. Since the heat sink 40 is in direct contact with the surface of the light emitting device 20 and facilitates the emission of heat generated from the light emitting device 20, the deterioration of the characteristics of the light emitting device 20 may be prevented. Also, the bump 11 attached to the bump pad 13 formed in the circuit pattern of the substrate 10 may be directly connected to a wiring circuit formed on a mounting substrate for mounting the light emitting device package to thereby receive an electrical signal from an external power source. Furthermore, the heat sink 40 and the bump 11 may have the same height such that they are in direct contact with the mounting substrate, whereby improved heat dispersion may be achieved.

As set forth above, in a light emitting device package and a method of manufacturing the same according to exemplary embodiments of the invention, since a wavelength conversion layer is formed by filling at least a portion of an opening of a substrate with a wavelength conversion material, the thickness and position thereof may be easily controlled, whereby the distribution of light wavelength-converted by the wavelength conversion layer can be improved. Accordingly, light uniformity can be enhanced and color stains can be reduced.

A wire is usually sealed with transparent epoxy or silicon polymer. However, according to exemplary embodiments of the invention, a wire is sealed with a molding material having superior mechanical properties, whereby the bonding reliability thereof can be enhanced.

In addition, in a case in which a plurality of chips are arranged within a single package by disposing a plurality of electrodes in a lower portion of a substrate and transmitting electrical signals thereto, they independently control the electrical signals so that a variety of levels of optical display can be facilitated.

While the present invention has been shown and described in connection with the exemplary embodiments, it will be apparent to those skilled in the art that modifications and variations can be made without departing from the spirit and scope of the invention as defined by the appended claims.

What is claimed is:

1. A light emitting device package, comprising:
   a substrate having a circuit pattern disposed on at least one surface thereof and including an opening therein;
   a wavelength conversion layer disposed within at least a portion of the opening with a wavelength conversion material; and
   at least one light emitting device disposed on a surface of the wavelength conversion layer and electrically connected to the circuit pattern;
   a sealing portion exposing at least a portion of a lower surface of the light emitting device opposite to a light emitting surface of the light emitting device; and
   a heat sink in contact with the exposed lower surface of the light emitting device.

2. The light emitting device package of claim 1, wherein the light emitting device is disposed on the same plane as a surface of the surface of the substrate on which the circuit pattern is disposed.

3. The light emitting device package of claim 1, wherein the wavelength conversion layer is disposed within the entirety of the opening with the wavelength conversion material such that the thickness and shape of the wavelength conversion layer is defined by the opening.

4. The light emitting device package of claim 1, wherein the wavelength conversion layer comprises a light-transmissive material containing phosphors.

5. The light emitting device package of claim 1, further comprising a bump attached to the circuit pattern of the substrate.

6. The light emitting device package of claim 1, wherein the opening has a size larger than or equal to a size of the light emitting device.

7. The light emitting device package of claim 1, wherein the opening comprises an inclined surface in at least a portion of an inner surface thereof.

8. The light emitting device package of claim 1, wherein at least a portion of the light emitting device is disposed within the opening.

9. The light emitting device package of claim 1, wherein the substrate is a printed circuit board.

10. The light emitting device package of claim 1, wherein the light emitting device comprises a plurality of light emitting devices, each of which independently receives an electrical signal from the circuit pattern.

11. The light emitting device package of claim 1, wherein:
the light emitting device comprises a plurality of light emitting devices, and
the plurality of light emitting devices are disposed on the surface of the wavelength conversion layer disposed within the opening of the substrate.

12. The light emitting device package of claim 5, wherein the bump is disposed on the same plane as a plane of the surface of the substrate on which the light emitting device is disposed.

13. The light emitting device package of claim 5, further comprising a mounting substrate on which the light emitting device is disposed,
wherein the bump is connected to the mounting substrate.

14. The light emitting device package of claim 1, wherein at least one surface of the substrate is coplanar with a surface of the wavelength conversion layer.

15. The light emitting device package of claim 14, wherein the wavelength conversion layer has a thickness that is the same as a thickness of the substrate.

16. The light emitting device package of claim 1, wherein the circuit pattern of the substrate is bonded to the light emitting device by a wire.

17. The light emitting device package of claim 16, wherein:
the sealing portion includes a highly reflective white resin, and
the wire is sealed with the sealing portion including the highly reflective white resin.

18. The light emitting device package of claim 1, further comprising a light-transmissive lens disposed on the wavelength conversion layer.

19. The light emitting device package of claim 18, wherein the light-transmissive lens covers a surface of the wavelength conversion layer.

20. The light emitting device package of claim 18, wherein the light-transmissive lens has an unevenness portion on a surface thereof.

21. A method of manufacturing a light emitting device package, the method comprising:
preparing a substrate having a circuit pattern formed on at least one surface thereof and including an opening;
filling at least a portion of the opening with a wavelength conversion material to thereby form a wavelength conversion layer;
disposing at least one light emitting device on a surface of the wavelength conversion layer disposed on the same plane as a plane of the surface of the substrate on which the circuit pattern is formed;
making electrical connection between the light emitting device and the circuit pattern of the substrate;
sealing the light emitting device with a sealing portion such that the sealing portion exposes at least a portion of a lower surface of the light emitting device opposite to a light emitting surface of the light emitting device; and
disposing a heat sink to be in contact with the exposed lower surface of the light emitting device.

22. The method of claim 21, further comprising disposing a light-transmissive lens on an upper surface of the wavelength conversion layer.

23. The method of claim 21, further comprising attaching a bump to the circuit pattern of the substrate so as to receive an electrical signal from an external power source.

24. The method of claim 21, wherein the electrical connection between the light emitting device and the circuit pattern of the substrate is made by wire-bonding therebetween using a wire.

25. The method of claim 24, wherein:
the sealing portion includes a highly reflective white resin, and
the wire is sealed with the sealing portion including the highly reflective white resin.

* * * * *